US006429318B1

(12) United States Patent
Mitzi

(10) Patent No.: US 6,429,318 B1
(45) Date of Patent: Aug. 6, 2002

(54) LAYERED ORGANIC-INORGANIC PEROVSKITES HAVING METAL-DEFICIENT INORGANIC FRAMEWORKS

(75) Inventor: David Brian Mitzi, Putnam, NY (US)

(73) Assignee: International Business Machines Corporaiton, Armonk, NY (US)

( * ) Notice: Subject to any disclaimer, the term of this patent is extended or adjusted under 35 U.S.C. 154(b) by 0 days.

(21) Appl. No.: 09/499,621

(22) Filed: Feb. 7, 2000

(51) Int. Cl.[7] .................. C07D 333/02; C09K 11/06; C30B 29/12
(52) U.S. Cl. .................. 549/3; 252/301.16; 117/68; 117/940
(58) Field of Search .................. 549/3; 252/301.16; 117/68, 940

(56) References Cited

U.S. PATENT DOCUMENTS

| | | | |
|---|---|---|---|
| 5,871,579 A | | 2/1999 | Liang et al. |
| 5,882,548 A | | 3/1999 | Liang et al. |
| 6,150,536 A | * | 11/2000 | Chondroudis et al. ......... 549/2 |
| 6,180,956 B1 | * | 1/2001 | Chondroudis et al. ........ 257/40 |

OTHER PUBLICATIONS

Appl. Phys. Lett. 65, (6), Aug. 8, 1994, pp. 676–678, M. Era et al., "Organic–Inorganic Heterostructure Electroluminescent Device Using a Layered Perovskite Semiconductor $(C_6H_5C_2H_4NH_3)_2PbI_4$".

Chemistry of Materials, 1999, vol. 11, No. 11, pp. 3028–3030, K. Chondroudis et al., "Electroluminescence from an Organic–Inorganic Perovskite Incorporating a Quaterthiophene Dye within Lead Halide Perovskite layers".

Inorganic Chemistry, vol. 38, No. 26, pp. 6246–6256, David B. Mitzi et al., "Design, Structure, and Optical Properties of Organic–Inorganic Perovskites Containing an Oligothiophene Chromophore", 1999.

Progress In Inorganic Chemistry, vol. 48, 1999, pp. 1–121, David B. Mitzi, "Synthesis, Structure, and Properties of Organic–Inorganic Perovskites and Related Materials".

Science, vol. 286, Oct. 29, 1999, pp. 945–947, C. R. Kagan et al., "Organic–Inorganic Hybrid Materials as Semiconducting Channels in Thin–Film Field-Effect Transistors".

Naturforsch., 53b, 927–931 (1998), pp. 927–931, G. A. Mousdis et al., Preparation, Structures and Optical Properties of $[H_3N(CH_2)_6NH_3]BiX_5$ (X=I, Cl) and $[H_3N(CH_2)_6NH_3]SbX_5$ (X=I, Br).

* cited by examiner

Primary Examiner—Deborah C. Lambkin
(74) Attorney, Agent, or Firm—Ohlandt, Greeley, Ruggiero & Perlr, L.L.P.; Daniel P. Morris

(57) ABSTRACT

An organic-inorganic perovskite having alternating layers of an inorganic anion layer and an organic cation layer is provided. More particularly, the inorganic anion layer of the organic-inorganic perovskite has a trivalent or higher valent metal halide framework and the organic cation layer has a plurality of organic cations capable of templating the metal-deficient inorganic anion layers within the perovskite structure. Methods of preparing the organic-inorganic perovskite according to the present invention are also provided.

23 Claims, 3 Drawing Sheets

ABX₃

LAYERED ORGANIC-INORGANIC PEROVSKITES HAVING METAL-DEFICIENT INORGANIC FRAMEWORKS

GOVERNMENT RIGHTS

This invention was made with Government support under Contract Number DAAL01-96-C-0095. The Government has certain rights in this invention.

FIELD OF THE INVENTION

The present invention relates to an organic-inorganic perovskite having alternating layers of an inorganic anion layer and an organic cation layer. More particularly, the present invention relates to an organic-inorganic perovskite in which the inorganic anion layer has a metal-deficient framework of corner-sharing metal halide octahedra and the organic cation layer has a plurality of organic cations capable of templating the inorganic anion layers within the perovskite structure.

BACKGROUND OF THE INVENTION

The basic structural motif of the perovskite family is the $ABX_3$ structure, which has a three-dimensional network of corner-sharing $BX_6$ octahedra (FIG. 1a and FIG. 1b). The B component in the $ABX_3$ structure is a metal cation that can adopt an octahedral coordination of X anions. The A cation is situated in the 12-fold coordinated holes between the $BX_6$ octahedra and is most commonly inorganic. By replacing the inorganic A cation with an organic cation, an organic-inorganic hybrid perovskite can be formed.

In these ionic compounds, the organic component is an intimate part of the structure, since the structure actually depends on the organic cation for charge neutrality. Therefore, such compounds conform to specific stoichiometries. For example, if X is a monovalent anion such as a halide, and A is a monovalent cation, then B should be a divalent metal. Layered, two-dimensional $A_2BX_4$, $ABX_4$ and one-dimensional $A_3BX_5$, $A_2A'BX_5$ perovskites also exist and are considered derivatives of the three-dimensional parent family.

The layered perovskites, for example, can be viewed as derivatives of the three-dimensional parent members, with y-layer-thick cuts, i.e., y=1, 2, 3 or more, from the three-dimensional structure interleaved with organic modulation layers. The layered compounds generally have inorganic layers with either <100> or <110> orientation relative to the original three-dimensional perovskite structure.

One <100>-oriented family of organic-inorganic perovskites has the general layered formula:

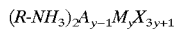

$$(R\text{-}NH_3)_2A_{y-1}M_yX_{3y+1}$$

where M is a divalent metal, X is a halogen atom (i.e. Cl, Br, I), A is a small inorganic or organic cation (e.g. $Cs^+$, $CH_3NH_3^+$), $R\text{-}NH_3^+$ is a larger aliphatic or aromatic mono-ammonium cation, and y is an integer defining the thickness of the inorganic layers. In this system, the ammonium group is hydrogen-bonded to the inorganic sheet halogens, with the organic tail extending into the space between the layers and holding the structure together via Van der Waals interactions.

The $(R\text{-}NH_3)_2MX_4$ (y=1) members of this family comprise the simplest and most numerous examples of organic-inorganic perovskites. Similar y=1 (or higher y) layered perovskite structures can also be stabilized by diammonium cations, yielding compounds with the general formula $(NH_3\text{-}R\text{-}NH_3) MX_4$. In these systems, there is no Van der Waals gap between the layers since the ammonium groups of each organic layer hydrogen bond to two adjacent inorganic layers.

D. B. Mitzi, Prog. Inorg. Chem., 48, 1 (1999) reviews the state of the art and describes organic-inorganic perovskites that combine the useful properties of organic and inorganic materials within a single molecular-scale composite.

U.S Pat. No. 5,882,548 to Liang et al. describes solid state preparation of perovskites based on divalent metal halide sheets.

C. R. Kagan et al., Science, 286, 945 (1999) and copending U.S. Pat. Appl. Ser. No. 09/261,515,257/40 Filed Mar. 3, 1999 the contents of which are incorporated herein by reference, describe integrating the self-assembling nature of organic materials with the high carrier mobilities characteristic of inorganic materials for possible use in Organic-Inorganic Field-Effect Transistors (OIFET's). A semiconductor-metal transition and high carrier mobility in the layered organic-inorganic perovskites based on a tin(II) iodide framework have also been described. These materials may be used as channel materials for field-effect transistors.

Copending U.S. Pat. Appl. Ser. No. 09/350,428, Filed Jul. 8, 1999, the contents of which are incorporated herein by reference, and D. B. Mitzi et al., Inorganic Chem., 38(26), 6246 (1999) describe combination of band gap tunability from the inorganic framework and high luminous efficiency from an organic dye component in single crystals and thin films of hybrid perovskites.

K. Chondroudis et al., Chem. Mater., 11, 3028 (1999) describe single crystals and thin films of the hybrid perovskites, which can be employed in Organic-Inorganic Light-Emitting Devices (OILED's).

M. Era et al., Appl. Phys. Lett. 65, 676 (1994) and previously cited K. Chondroudis et al., Chem. Mater., 11, 3028 (1999) describe unique physical properties such as strong room temperature photoluminescence, third harmonic generation, and polariton absorption arising from excitons in the inorganic sheets. The excitons display large binding energies (>300 meV) and oscillator strength. The strong photoluminescence and the ability to tune the emission wavelength by means of incorporating different metal or halogen atoms in the structure make these perovskites attractive as emitter materials in electroluminescent devices. These materials may be used as channel materials for field-effect transistors.

Thus, despite the numerous examples of layered perovskites described above that are based on divalent metal halides and simple organic diammonium salts, there are no examples of layered organic-inorganic perovskite structures prepared from trivalent or higher valent metal halides combined with organic diammonium salts.

Furthermore, attempts to stabilize trivalent bismuth based layered perovskite structures with relatively short chain alkylammonium cations, which are known to stabilize layered perovskite frameworks based on divalent metal cations, have not been successful. Such attempts have resulted in entirely different structures as described by G. A. Mousdis et al., Z. Naturforsch., 53b, 927 (1998), wherein bismuth halide structures having one-dimensional zig-zag chains of corner-sharing $BiX_6$ octahedra have been obtained.

Accordingly, it is an object of the present invention to provide novel semiconducting or insulating organic-inorganic hybrid perovskites that are based on metal-deficient inorganic frameworks.

It is another object of the present invention to provide low-cost, easily processed organic-inorganic perovskites, which can be used as materials in flat panel displays, non-linear optical/photoconductive devices, chemical sensors, emitting and charge transporting layers in organic-inorganic light-emitting diodes, organic-inorganic thin-film transistors and as channel layers in organic-inorganic field-effect transistors.

It is a further object of the present invention to provide simple and cost-effective methods of preparing the novel organic-inorganic perovskites.

These and other objects of the present invention will become apparent by the novel perovskite compositions and the methods of preparing the perovskite compositions.

SUMMARY OF THE INVENTION

The present invention includes an organic-inorganic perovskite, comprising alternating layers of:

an inorganic anion layer having a metal-deficient framework of corner-sharing metal halide octahedra, wherein the metal has a valence n of greater than 2, the metal halide layer being represented by the formula:

$$(M^{n+})_{2/n}V_{(n-2)/n}X_4^{2-}$$

wherein M is a metal; V is a vacancy; X is a halide; and n is an integer greater than 2; and an organic cation layer having a plurality of organic cations capable of templating the metal-deficient inorganic anion layers within the perovskite structure.

The present invention further includes a first method of preparing an organic-inorganic perovskite having alternating inorganic anion and organic cation layers, comprising the steps of: (a) contacting (i) a hydrogen halide salt of an organic diamine and (ii) a metal halide having a metal valence greater than 2, wherein the contacting is carried out in the presence of a solvent and hydrogen halide to produce a solution; and (b) supersaturating said solution to precipitate said perovskite. Preferably, the reaction mixture is supersaturated by cooling.

The present invention still further includes a second method of preparing an organic-inorganic perovskite having alternating inorganic anion and organic cation layers, comprising the step of: contacting (i) a hydrogen halide salt of an organic diamine and (ii) a metal halide having a metal valence greater than 2, wherein the contacting is carried out at a temperature and for a length of time sufficient to produce a perovskite.

DETAILED DESCRIPTION OF THE INVENTION

Figure 1A:
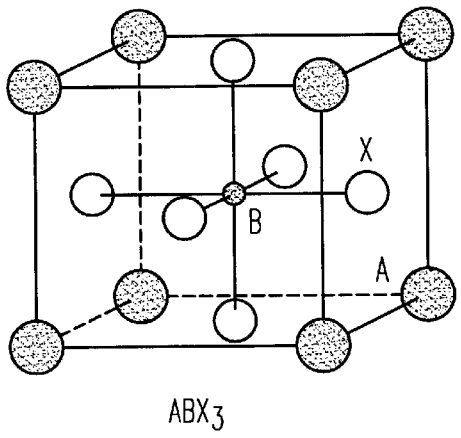
FIG. 1a (on the left) is a three-dimensional view of an $ABX_3$ unit cell.
Figure 1B:
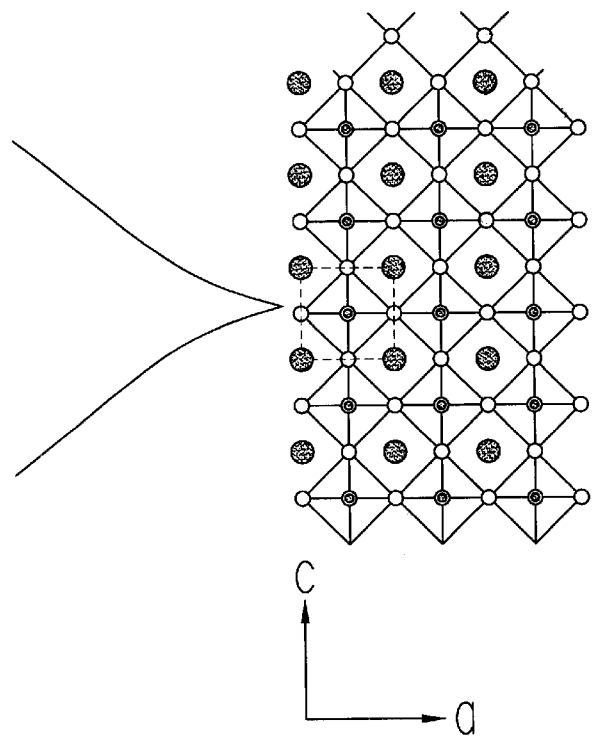
FIG. 1b (on the right) is an overall view of the full three-dimensional structure of the basic $ABX_3$ perovskite structure, wherein the dotted square corresponds to one unit cell.

The perovskites according to the present invention have alternating inorganic anion and organic cation layers. Trivalent and higher-valent metal halide frameworks can be incorporated into the layered organic-inorganic perovskite structure by stabilizing the structures through the use of organic cations that can template the formation of metal-deficient layers of corner-sharing metal halide octahedra, thereby producing novel organic-inorganic perovskites that are semiconducting or insulating.

Within the organic-inorganic perovskite structural family, the inorganic framework has layers of corner-sharing metal halide octahedra. In order to counterbalance the positive charge from the cationic organic layers, the known anionic metal halide layers (e.g. $MX_4^{2-}$) are generally confined to divalent metals where, for example, $M=Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Eu^{2+}$ with $X=Cl^-$, $Br^-$, $I^-$. In the examples of the prior art, the inorganic frameworks of previously known single-layer (i.e. y=1) organic-inorganic perovskites have $MX_4^{2-}$ sheets, where $M^{2+}$ is a divalent metal that can adopt an octahedral coordination.

The present invention includes novel organic-inorganic perovskites with metal halide frameworks based on metals having a valence of greater than 2. This extends the family of layered organic-inorganic perovskites to include sheets of higher-valent metal halide octahedra by incorporating vacancies on the M site. According to the present invention, the number of vacancies on the M site exactly balances the difference in charge between the expected divalent metal cation and the actual higher valent species.

In general, for an n-valent metal, the sheets of metal halide octahedra incorporating vacancies on the M site is represented by the formula:

$$(M^{n+})_{2/n}V_{(n-2)/n}X_4^{2-}$$

wherein M is a metal that can adopt an octahedral coordination; V represents a vacancy; X is a halide; and n is an integer corresponding to the valence of the metal. The vacancy V in the above formula is commonly left out of the formula. It is included herein for clarity.

For the compositions of the present invention based on trivalent or higher valent metals, n is an integer greater than 2. Preferably, n is from 3 to 5, corresponding to a metal that has a valence of 3 to 5, including tri and tetravalent first row transition metals and lanthanides.

Thus, in the case of trivalent metal cations, such as $Bi^{3+}$, $Sb^{3+}$, $In^{3+}$, $La^{3+}$, $Gd^{3+}$ and $Fe^{3+}$, the sheets are represented by the formula:

$$(M^{3+})_{2/3}V_{1/3}X_4^{2-}$$

Similarly, for a tetravalent metal, such as $Sn^{4+}$, $Te^{4+}$ or $Hf^{4+}$, the formula can be written as:

$$(M^{4+})_{1/2}V_{1/2}X_4^{2-}$$

and for a pentavalent metal, such as $Nb^{5+}$, $Ta^{5+}$ or $Mo^{5+}$, the formula would be:

$$(M^{5+})_{2/5}V_{3/5}X_4^{2-}$$

Preferably, the metal in the metal salt used to prepare the organic-inorganic perovskite of the present invention includes $Bi^{3+}$, $Sb^{3+}$, $In^{3+}$, $La^{3+}$, $Gd^{3+}$, $Fe^{3+}$, $Eu^{3+}$, $Sn^{4+}$, $Te^{4+}$, $Hf^{4+}$, $Nb^{5+}$, $Ta^{5+}$, $Mo^{5+}$ and a combination thereof. More preferably, the metal in the metal salt includes $Bi^{3+}$, $Sb^{3+}$, and a combination thereof.

The halide in the metal salt used to prepare the organic-inorganic perovskite of the present invention can be fluoride, chloride, bromide, iodide, or a combination thereof. Preferably, the halide is iodide.

Trivalent metal iodides, such as bismuth(III) iodide, antimony(III) iodide or mixtures thereof are most preferred.

While the above formula is straightforward, as vacancies are introduced on the M site of the inorganic layers, there is a driving force towards the formation of non-perovskite structures that do not have vacancies. Thus, for example, when trivalent $Bi^{3+}$ metal halides are combined with simple alkyldiammonium salts, a layered organic-inorganic perovskite structure does not form, despite the occurrence of numerous examples of layered perovskites based on divalent metal halides with the same alkyldiammonium cations. When trivalent $Bi^{3+}$ metal halides are combined with simple alkyldiammonium salts, as described by G. A. Mousdis et al. in the previously cited Z. Naturforsch., 53b, 927 (1998), bismuth halide structures having one-dimensional zig-zag chains of corner-sharing $BiX_6$ octahedra have been obtained.

Consequently, in order to stabilize the layered perovskite framework with the higher valent metals, it is also necessary to chose an organic counter-cation that will facilitate or template the formation of the characteristic inorganic layers of corner-sharing metal halide octahedra within the perovskite structures.

Accordingly, the present invention employs an organic cation, such as an organic diammonium cation, as the organic counter-cation to template and facilitate the formation of the characteristic inorganic anion layers of corner-sharing metal halide octahedra within the perovskite structures. The perovskites will self-assemble by introducing vacancies on the metal site in the correct quantity to counterbalance the larger charge on the metal site. Thus, using such organic diammonium cations produces an organic-inorganic perovskite structure with alternating inorganic anion and organic cation layers.

The organic diammonium cation can be any dication derived from a hydrogen halide and an organic diamine to produce a diammonium salt, such as an organic diammonium dihalide. The organic cation must have an appropriate size and shape to fit within the layered perovskite framework and have intermolecular interactions that favor the formation of the organic-inorganic layered perovskite structures. Preferably, the organic diammonium cation has 6 to 60 carbon atoms, more preferably 10 to 30 carbon atoms.

It has been surprisingly found that rigid organic cations, such as organic diammonium cations, favor the formation of the organic-inorganic layered perovskite structures. The rigid organic cations that have limited conformational flexibility include dications derived from a diamine such as bis-(aminoalkyl)-substituted arylene, bis-(aminoalkyl)-substituted heteroarylene and a combination thereof. Preferably, the diamine has a string of 2–8 aromatic moieties each of which can independently be arylene or heteroarylene. Each such aromatic moiety can independently be phenylene, naphthylene, anthracene, phenanthrene, furan or thiophene.

Preferably, the rigid organic cation has a string of 2 to 8 arylenes and/or heteroarylenes, more preferably, a string of 3 to 6 thiophenes.

Suitable aminoalkyl groups indepenently include aminomethyl, aminoethyl, aminopropyl and aminobutyl. Aminoethyl groups are preferred.

An example of a diamine that can be protonated with a hydrogen halide to produce an organic diammonium cation suitable for use in the present invention is the diammonium salt derived from 5,5'''-bis (aminoethyl)-2,2':5',2":5",2'''-quaterthiophene (AEQT) and a hydrogen halide. More preferably, the diammonium salt is derived from 5,5'''-bis (aminoethyl)-2,2':5',2":5",2'''-quaterthiophene (AEQT) and hydrogen iodide.

Figure 2A:
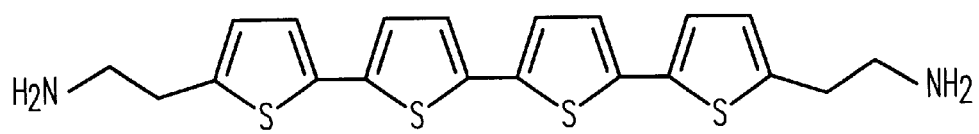
FIG. 2a illustrates a single AEQT molecule.
Figure 2B:
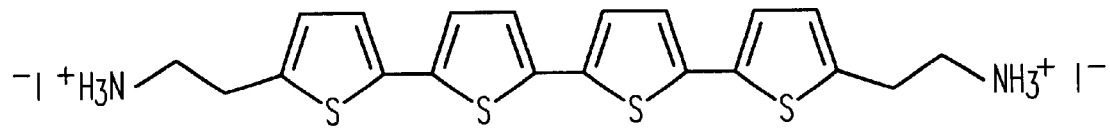
FIG. 2b illustrates a single AEQT.2HI molecule.

A schematic representation of the 5,5'''-bis (aminoethyl)-2,2':5',2":5",2'''-quaterthiophene (AEQT) molecule can be seen in FIG. 2a. By reacting AEQT with hydroiodic acid (HI), the amino groups ($—NH_2$) become positively charged ($—NH_3^+$). To balance the charge, two iodide anions ($I^-$) form ionic bonds with the corresponding ammonium cations ($—NH_3^+$). The resulting iodide salt $C_{20}H_{22}S_4N_2I_2$ or AEQT·2HI (FIG. 2b) is the compound used as the source of the organic diammonium cations.

Figure 3:
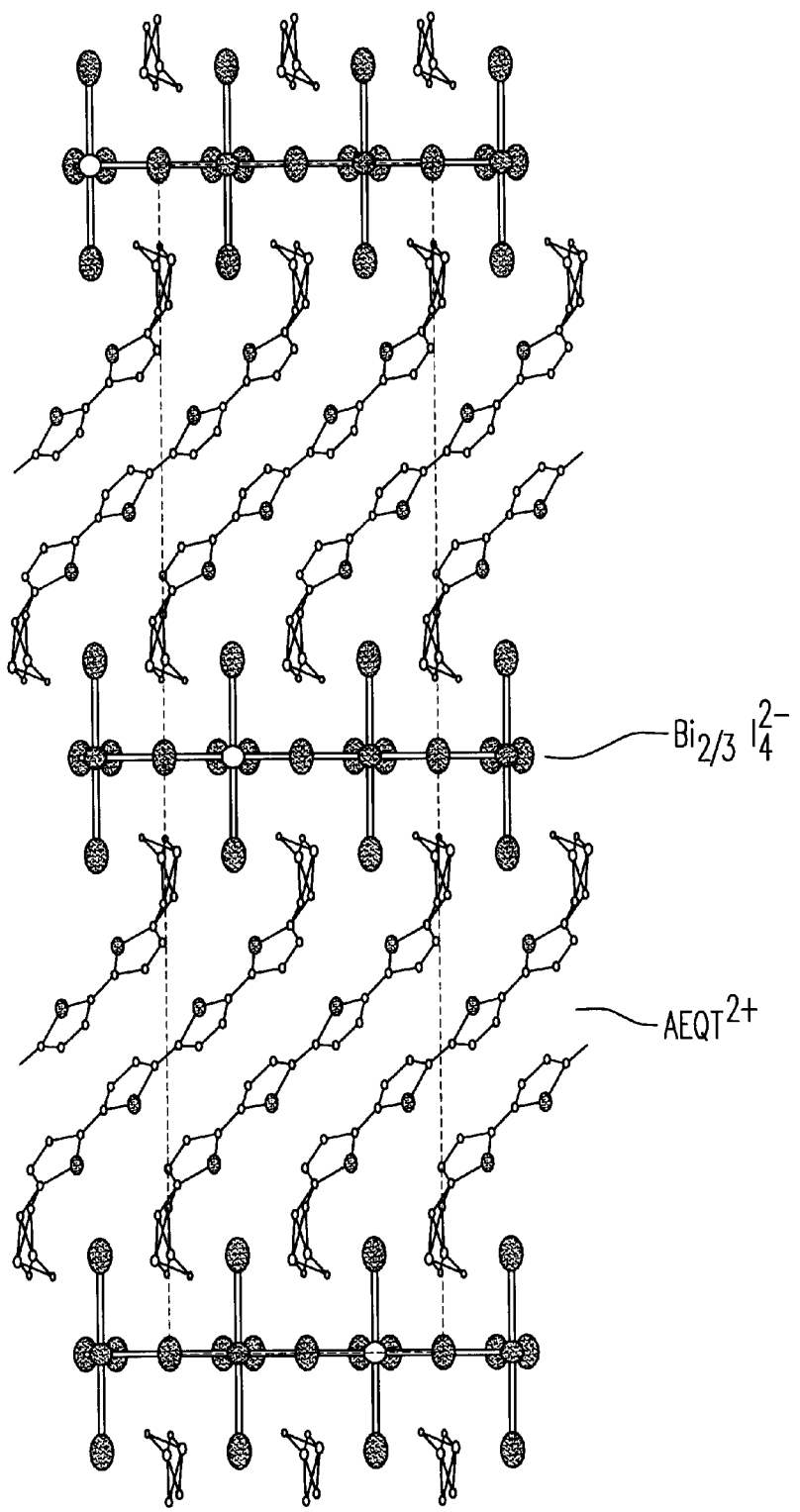
FIG. 3 is the crystal structure of (Diprotonated AEQT) $Bi_{2/3}I_4$ organic-inorganic perovskite.

FIG. 3 depicts the single crystal X-ray structure of (Diprotonated AEQT)$Bi_{2/3}I_4$ organic-inorganic perovskite according to the present invention having alternating layers of an inorganic anion layer and an organic cation layer. The blackened sites in the inorganic layers represent occupied bismuth sites with the white sites representing randomly positioned vacancies.

The present invention further includes a first and a second method of preparing an organic-inorganic perovskite having alternating inorganic anion and organic cation layers.

In the first method of the present invention, which is a method based on solution chemistry, a hydrogen halide salt of an organic diamine and a metal halide having a metal valence greater than 2 are contacted. Contacting is carried out in the presence of a solvent and hydrogen halide to produce a solution. Thereafter, the solution is supersaturated to precipitate the perovskite.

Preferably, contacting is carried out at a super-ambient temperature and the supersaturating is carried out by cooling to a sub-ambient temperature at a rate sufficient to precipitate the perovskite.

Preferably, a hydrogen halide is added to ensure that the hydrogen halide salt of the organic diamine remains in the protonated form, or to ensure complete protonation of the diamine if the hydrogen halide salt of the organic diamine is prepared in situ from hydrogen halide and an organic diamine.

According to this method, a solvent is present in the reaction mixture to dissolve the various ingredients to allow the inorganic anion and organic cation layers to organize into an alternating organic-inorganic perovskite structure and, upon supersaurating, precipitate the perovskite from the reaction mixture.

Any solvent or combination of solvents that is capable of dissolving the various ingredients at a super-ambient temperature and precipitating the alternating organic-inorganic perovskite at a sub-ambient temperature may be used.

Preferably, the solvent is selected from protic solvents such as monohydric and polyhydric alcohols. Such protic solvents include water, ethylene glycol, propylene glycol, butylene glycol, methanol, ethanol, propanol, butanol, particularly 2-butanol, and a mixture thereof.

Non-protic solvents, such as acetonitrile, dimethyl formamide and tetrahydrofuran can also be used either alone or in combination with a protic solvent.

A combination of protic solvents with other, less polar protic or non-protic solvents may also be used. Thus, the contacting step may be carried out using a polar solvent, such as ethylene glycol, to produce a solution of the various ingredients and thereafter, a second, less polar solvent, such as 2-butanol, may be added. It is believed that addition of 2-butanol to the solution enhances the temperature dependence of the solubility of the product. Thus, when the reaction is carried out without adding 2-butanol, substantially lower yields are obtained upon cooling.

To obtain the perovskite, the reaction mixture is supersaturated. The reaction mixture can be supersaturated by cooling, as described above, by adding a non-polar solvent to the mixture or by concentrating the reaction mixture by evaporating the solvent. Preferably, the reaction mixture is supersaturated by cooling.

Supersaturating the reaction mixture allows the inorganic anion and organic cation layers to organize into an alternating organic-inorganic perovskite structure and precipitate from the reaction mixture.

Preferably, the ingredients are contacted at a super-ambient temperature from about 80 to 140° C., more preferably at a super-ambient temperature of about 116° C. The resulting reaction mixture is then cooled slowly to a sub-ambient temperature, usually in the range from about −30 to +20° C., preferably to a sub-ambient temperature, which is about −20° C.

Slow cooling allows the formation of single crystals. Preferably, the cooling rate is about 1.5° C./hr. However, somewhat faster or slower rates may also be used.

In the second method of the present invention, a hydrogen halide salt of an organic diamine and a metal halide having a metal valence greater than 2 are contacted in the absence of a solvent. Contacting is carried at a temperature and for a length of time sufficient to produce a perovskite.

The reactants are introduced either as a solid or as a liquid in the absence of a solvent. The reaction mixture is maintained at a temperature at which reaction between the hydrogen halide salt of the organic diamine and the metal halide occurs to produce a perovskite according to the present invention. The temperature at which reaction occurs depends on the nature of the reactants and can be determined by any of the methods known to a person skilled in the art. Such methods include analysis by Differential Scanning Calorimetry (DSC), X-ray analysis of samples withdrawn from the reaction mixture and observation of visual indicators, such as color change.

The organic-inorganic perovskites of the present invention may be further processed to produce organic-inorganic perovskite crystals or thin films by well-known methods including the solution-based or evaporative techniques described by D. B. Mitzi in the previously cited *Prog. Inorg. Chem.*, 48, 1 (1999) and by Liang et al. in U.S. Pat. No. 5,871,579.

The organic-inorganic perovskite of the present invention having alternating layers of an inorganic anion and organic cation layers are semiconducting or insulating hybrid perovskites. They have utility in flat panel displays, non-linear optical/photoconductive devices and chemical sensors. They can be used as materials for emitting and charge transporting layers in organic-inorganic light-emitting diodes (OILED's), organic-inorganic thin-film transistors (OITFT's) and organic-inorganic field-effect transistors (OIFET's).

The following Examples are included for the purpose of illustrating the present invention, not to limit the scope thereof.

EXAMPLE 1

$BiI_3$ (99.999%, anhydrous, available from Aldrich Chemical Company, Inc., Milwaukee, Wis.) was purified by sublimation. Equimolar quantities of 5,5'''-bis(aminoethyl)-2,2':5',2'':5'',2'''-quaterthiophene di-hydroiodide (AEQT·2HI), (161.4 mg; 0.24 mmol, prepared by the method described by H. Muguruma et al., *J. Heterocyclic Chem.*, 33, 173(1996)) and $BiI_3$ (141.5 mg; 0.24 mmol) were added to a test tube under an inert atmosphere. The contents completely dissolved at 112° C. in a solvent mixture of ethylene glycol (36 ml, 99.8%, anhydrous, from Aldrich) and concentrated aqueous HI (57 wt. %) (0.6 ml, 99.99%, stabilized, from Aldrich). Upon gradual addition of 2-butanol (18 ml, 99.5%, anhydrous, from Aldrich), a small amount of red precipitate began to form. Heating the mixture to 116° C. in a sealed tube redissolved the precipitate. Subsequent slow cooling of the solution at 1.5° C./hr to −20° C., produced a high yield (220 mg) of dark red, sheetlike crystals of the desired (Diprotonated AEQT)$Bi_{2/3}I_4$ perovskite.

Chemical analysis (performed in duplicate) of this product was consistent with the proposed formula:

Theoretical (found): C 22.54 (22.6), H 2.08 (2.2), N 2.63 (2.5), S 12.04 (12.1).

Single crystals of (Diprotonated AEQT)$Bi_{2/3}I_4$ were examined by single crystal X-ray diffraction, yielding the structure shown in FIG. 3. The structure analysis confirms that $Bi^{3+}$ is stabilized within an organic-inorganic layered perovskite framework, with the monoclinic lattice constants a=39.75(1) Å, b=5.980(2) Å, c=12.094(4) Å, and β=92.251(5)°. The inorganic sheets have corner-sharing $BiI_6$ octahedra, with one-third of the bismuth sites vacant, without any apparent ordering of the vacancies. The quaterthiophene moieties are well ordered, adopting a syn-anti-syn conformation and a herringbone packing arrangement with respect to a nearest-neighbor quaterthiophene.

Comparison of the structure of the (Diprotonated AEQT)$Bi_{2/3}I_4$ with the structure of (Diprotonated AEQT)$PbBr_4$ or (Diprotonated AEQT)$PbI_4$ described in the previously incorporated copending U.S. Pat. Appl. Ser. No. 09/350,428, Filed Jul. 8, 1999, revealed that (Diprotonated AEQT)$Bi_{2/3}I_4$ of the present invention is isostructural with (Diprotonated AEQT)$PbBr_4$ and (Diprotonated AEQT)$PbI_4$, except that the divalent lead has been replaced with a trivalent metal, with vacancies on the metal site.

It is believed that the interactions between organic oligomers give rise to the well-defined layered packing of the organic cations, which act to template the formation of the alternating metal-deficient inorganic layers.

Attempts to prepare a layered perovskite structure with trivalent bismuth and alkyl diammonium cations were not successful. Instead, entirely different structures having one-dimensional zig-zag chains of corner-sharing $BiX_6$ octahedra similar to those described by Mousdis et al. in the previously cited *Z. Naturforsch.*, 53b, 927 (1998) were obtained.

EXAMPLE 2

The procedure of Example 1 was repeated with the exception of replacing bismuth(III) iodide with antimony (III) iodide. Single crystal structure analysis confirmed that the antimony compound (Diprotonated AEQT)$Sb_{2/3}I_4$ is isostructural with the bismuth compound. (Diprotonated AEQT)$Sb_{2/3}I_4$ had the following lattice constants: a=39.439(7) Å, b=5.955(1) Å, c=12.066(2) Å, and β=92.24(1)°.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. An organic-inorganic perovskite, comprising alternating layers of:

an inorganic anion layer having a metal-deficient framework of corner-sharing metal halide octahedra, wherein said metal has a valence n of greater than 2, said metal halide layer being represented by the formula:

$$(M^{n+})_{2/n} V_{(n-2)/n} X_4^{2-}$$

wherein M is a metal; V is a vacancy; X is a halide; and n is an integer greater than 2; and an organic cation layer having a plurality of organic cations capable of templating said metal-deficient inorganic anion layers within the perovskite structure.

2. The organic-inorganic perovskite of claim 1, wherein said metal has a valence from 3 to 5.

3. The organic-inorganic perovskite of claim 2, wherein said metal is selected from the group consisting of $Bi^{3+}$, $Sb^{3+}$, $In^{3+}$, $La^{3+}$, $Gd^{3+}$, $Fe^{3+}$, $Eu^{3+}$, $Sn^{4+}$, $Te^{4+}$, $Hf^{4+}$, $Nb^{5+}$, $Ta^{5+}$, $Mo^{5+}$ and a combination thereof.

4. The organic-inorganic perovskite of claim 3, wherein said metal is selected from the group consisting of $Bi^{3+}$, $Sb^{3+}$, and a combination thereof.

5. The organic-inorganic perovskite of claim 1, wherein said halide is iodide.

6. The organic-inorganic perovskite of claim 1, wherein said metal has a valence from 3 to 5 and said halide is iodide.

7. The organic-inorganic perovskite of claim 1, wherein said metal halide is selected from the group consisting of bismuth(III) iodide, antimony(III) iodide, and a mixture thereof.

8. The organic-inorganic perovskite of claim 1, wherein said organic cation is an organic diammonium cation.

9. The organic-inorganic perovskite of claim 8, wherein said organic diammonium cation is derived from a diamine selected from the group consisting of bis-(aminoalkyl)-substituted arylene, bis-(aminoalkyl)-substituted heteroarylene and a combination thereof.

10. The organic-inorganic perovskite of claim 9, wherein said diamine has a string of 2–8 aromatic moieties each independently selected from the group consisting of phenylene, naphthylene, anthracene, phenanthrene, furan and thiophene.

11. The organic-inorganic perovskite of claim 10, wherein said organic diammonium cation is a diammonium salt derived from 5,5'''-bis(aminoethyl)-2,2':5',2":5",2'''-quaterthiophene and hydrogen halide.

12. A method of preparing an organic-inorganic perovskite having alternating inorganic anion and organic cation layers, said method comprising the steps of:

(a) contacting (i) a hydrogen halide salt of an organic diamine and (ii) a metal halide having a metal valence greater than 2, wherein said contacting is carried out in the presence of a solvent and hydrogen halide to produce a solution; and (b) supersaturating said solution to precipitate said perovskite.

13. The method of claim 12, wherein said contacting is carried out at a super-ambient temperature and said supersaturating is carried out by cooling to a sub-ambient temperature.

14. The method of claim 13, wherein said super-ambient temperature is from about 80 to 140° C.

15. The method of claim 13, wherein said super-ambient temperature is about 116° C.

16. The method of claim 13, wherein said sub-ambient temperature is from about <30 to +20° C.

17. The method of claim 16, wherein said sub-ambient temperature is about −20° C.

18. The method of claim 13, wherein said cooling is carried out at a rate of about 1.5° C./hr.

19. The method of claim 12, wherein said solvent is selected from the group consisting of water, ethylene glycol, propylene glycol, butylene glycol, methanol, ethanol, propanol, butanol, 2-butanol, acetonitrile, dimethyl formamide, tetrahydrofuran and a mixture thereof.

20. The method of claim 12, wherein said metal halide is selected from the group consisting of bismuth(III) iodide, antimony(III) iodide, and a mixture thereof.

21. The method of claim 12, wherein said hydrogen halide salt is 5,5'''-bis(aminoethyl)-2,2':5',2":5",2'''-quaterthiophene dihydroiodide.

22. The method of claim 12, wherein said hydrogen halide salt is prepared in situ from hydrogen halide and an organic diamine.

23. A method of preparing an organic-inorganic perovskite having alternating inorganic anion and organic cation layers, said method comprising the step of:

contacting (i) a hydrogen halide salt of an organic diamine and (ii) a metal halide having a metal valence greater than 2, wherein said contacting is carried-out at a temperature and for a length of time sufficient to produce a perovskite.

* * * * *